(12) United States Patent
Keszler et al.

(10) Patent No.: US 7,534,377 B2
(45) Date of Patent: May 19, 2009

(54) BORATE CRYSTALS FOR OPTICAL FREQUENCY CONVERSION

(75) Inventors: Douglas A. Keszler, Corvallis, OR (US); Jennifer L. Stone-Sundberg, Portland, OR (US); Ning Ye, Corvallis, OR (US); Michael A. Hruschka, Albany, OR (US)

(73) Assignee: State of Oregon acting by and through the State Board of Higher Education on behalf of Oregon State University, Corvallis, OR (US)

( * ) Notice: Subject to any disclaimer, the term of this patent is extended or adjusted under 35 U.S.C. 154(b) by 474 days.

(21) Appl. No.: 10/520,364

(22) PCT Filed: Jul. 14, 2003

(86) PCT No.: PCT/US03/22075
§ 371 (c)(1),
(2), (4) Date: Jan. 3, 2005

(87) PCT Pub. No.: WO2004/007352
PCT Pub. Date: Jan. 22, 2004

(65) Prior Publication Data
US 2005/0247918 A1 Nov. 10, 2005

Related U.S. Application Data

(60) Provisional application No. 60/395,681, filed on Jul. 12, 2002.

(51) Int. Cl.
G02B 5/30 (2006.01)
G02F 1/355 (2006.01)
C01F 17/00 (2006.01)
C01B 35/12 (2006.01)
H01S 3/10 (2006.01)
G02F 3/02 (2006.01)
H01S 3/30 (2006.01)

(52) U.S. Cl. .................. 252/584; 372/21; 372/22; 423/263; 423/279

(58) Field of Classification Search ............... 252/584; 372/21, 22; 423/263, 279
See application file for complete search history.

(56) References Cited

U.S. PATENT DOCUMENTS

| | | | |
|---|---|---|---|
| 4,791,927 A * | 12/1988 | Menger | 606/3 |
| 5,684,813 A | 11/1997 | Keszler | |
| 5,879,803 A * | 3/1999 | Masaki et al. | 428/378 |
| 6,238,593 B1 * | 5/2001 | Huguenin et al. | 423/263 |
| 6,419,855 B1 | 7/2002 | Keszler et al. | |
| 2008/0043787 A1 | 2/2008 | Keszler et al. | |

FOREIGN PATENT DOCUMENTS

| | | |
|---|---|---|
| WO | WO 00/015731 | 3/2000 |
| WO | WO 03/105238 A1 | 12/2003 |
| WO | WO 2004/007352 A2 | 1/2004 |

OTHER PUBLICATIONS

Gruber et al., "Spectroscopic properties of nonlinear NdSc3(BO3)4", Journal of Applied Physics, 87:10, pp. 7159-7163 (May 15, 2000).*
Peterson et al., Stoichiometric, trigonal hunite borate CeSc3*BO3)4, International Journal of Inorganic Materials, 2:1, pp. 101-106, Feb. 1, 2000).*
Chemical Abstracts, CAS, STN, Columbus, OH, AN 136:77001 CA, correspond to CN 1298217 A (entered STN: Jan. 24, 2002), p. 1, abstract.*
Leonyuk N. I. and Leonyuk L.I., "Growth and Characterization ot ladVI3(IzIO3)4 Crystals," Prog. Crystal Growth and Charact., vol. 31, 1995-month unavailable, pp. 1 & 263-278.*
Gruber et al., "Spectroscopic properties of nonlinear NdSc3(BO3)4", Journal of Applied Physics, 87:10, pp. 7159-7163 (May 15, 2000).
Peterson et al., Stoichiometric, trigonal hunite borate CeSc3*BO3)4, International Journal of Inorganic Materials, 2:1, pp. 101-106 (Feb. 1, 2000).
Blasse G, Kellendonk F & van der Belt, T., "On the Luminescence of Bismuth, Cerium, and Chromium and Yttrium Aluminium Borate," J. Chem. Phys 76(3) 1982*, 1194-1201.
Brenier A., "Tunable Coherent Infrared Generation Near 2.5 μm from Self-Difference Frequency Mixing in $YAl_3(BO_3)_4:Nd^{3+}$," Appl. Opt. 43, 6007-6010 (2004)*.
Durmanov S.T. et al. "Binary rare-earth scandium borate for diode-pumped lasers," Optical Materials, 18, pp. 243-384, (Nov. 2001).
Jia G. et al., "Growth and Thermal and Spectral Properties of a New Nonlinear Optical Crystal $TmAl_3(BO_3)_4$", Crystal Growth and Design, 5(3), 2005*,949-952.
Kuz'min O.V. et al. "Cerium scandium borate—an active nonlinear medium for diode-pumped lasers," Quantum Electronics, 28(1) 1998*,50-54.
Leonyuk N. I. and Leonyuk L.I., "Growth and Characterization of $RM_3(BO_3)_4$ Crystals," Prog. Crystal Growth and Charact. 31, 1995*, pp. 179-262.
Mills A.D., Crystallographic Data for New Rare Earth Borate Compounds, $RX_3(BO_3)_4$, Inorg. Chem, 1, 1962*, 960-961.
Peterson G.A., Keszler D.A., and Reynolds T.A., "Stoichiometric, trigonal huntite borate $CeSc_3(BO_3)_4$," Intern. J. Inorg. Mater. 2, 2000*, 101-106.
Keszler, Douglas A., "Borates for optical frequency conversion," J. Current Opinion in Solid State & Materials Science vol. 1, 1996, pp. 204-211.

(Continued)

Primary Examiner—Daniel S Metzmaier
(74) Attorney, Agent, or Firm—Klarquist Sparkman LLP

(57) ABSTRACT

Novel nonlinear optical materials are described having the general formula $M_xM'_ySc_z(BO_3)_4$ where M and M'are metals, typically rare earth metals, and the sum of x, y, and z is about four. One example of such a material is $La_{0.7}Y_{0.3}Sc_3(BO_3)_4$. Exemplary crystalline materials according to the general formula exhibit useful optical characteristics and desirable physical properties for nonlinear optical applications. Novel compositions and devices using the nonlinear optical materials also are described.

10 Claims, 4 Drawing Sheets

OTHER PUBLICATIONS

Peterson, Dr. Gregory A., "Huntite Crystals for UV Nonlinear Optics and Self-Doubled Lasers," *Scientific Materials Corp.*, (Abstract Ballistic Missile Defense Organization Counsel, 2001.), online @ http://www.dodsbir.net/selections/abs011/bmdoabs011.htm , page 1 of 1.

Meyn, Jan-Peter et al., "Spectroscopic Properties and Efficient Diode-Pumped Laser Operation of Neodymium-Doped Lanthanum Scandium Borate," *J. of Quantum Electronics* 30(4), 1994, 913-917.

Ostroumov, V. et al., "Crystal growth, spectroscopic and laser characterization of Nd: CSB crystals," *J. of Luminescence* 72-74, 1997, 826-828.

Ye, Ning et al., "Nonlinear Optical Crystal $Y_xLa_ySc_z(BO_3)_4(x+y+z=4)$," *Chem. Mater.* 17, 2005, 2687-2692.

Ye, Ning et al., "Growth of nonlinear optical crystal $Y_{0.57}La_{0.72}Sc_{2.71}(BO_3)_4$," *J. of Crystal Growth* 292, 2006, 464-467.

\* cited by examiner

Phase-matching curve for YLSB

Polished YLSB crystal

Transmission spectra for YLSB crystals

BORATE CRYSTALS FOR OPTICAL FREQUENCY CONVERSION

CROSS REFERENCE TO RELATED APPLICATION

This is a national stage application under 35 U.S.C. § 371 of International Application No. PCT/US03/22075, filed Jul. 14, 2003, and claims the benefit of the earlier filing date of prior U.S. provisional application No. 60/395,681, filed on Jul. 12, 2002, which is incorporated herein by reference.

FIELD

This disclosure concerns a novel class of compounds having useful optical properties (e.g., nonlinear optical properties), compositions comprising such compounds, methods for their manufacture and use, and devices employing such materials.

BACKGROUND

Nonlinear optical (NLO) materials are unusual because their optical properties are affected by light. For instance, light polarizes certain materials. If the polarization is linear, then light radiated by the material has the same frequency as the absorbed light. NLO materials are polarized in a nonlinear manner. As a result, the frequency of the light produced by a nonlinear optical material is some value times the frequency of the light incident on the material.

Laser technology has benefited from the development of new NLO materials. However, known NLO materials often are suitable only for those applications for which they were particularly designed. As a result, new NLO materials continually must be developed having properties selected for a particular application.

Among known NLO crystals, borates of the type $LiB_3O_5$ and $BaB_2O_4$ are commercially important, at least in part, because they generate high-power laser light. $LiB_3O_5$ crystals have been used in patented devices. For example, Chuangtian et al.'s U.S. Pat. No. 4,863,283 describes an NLO device that uses a single $LiB_3O_5$ crystal. While $LiB_3O_5$ is widely used to convert near infrared light into visible light, it has an insufficient birefringence to allow direct second-harmonic generation of UV light. Thus, applications using $LiB_3O_5$ generally have been limited to selected wavelengths. In contrast, $BaB_2O_4$ exhibits a birefringence that is sufficient for UV generation, but its small angular acceptance limits general applicability.

The material $CsLiB_6O_{10}$ (Keszler, U.S. Pat. No. 5,684,813, incorporated herein by reference; Sasaki et al. U.S. Pat. No. 6,296,784) has an intermediate birefringence to that of $LiB_3O_5$ and $BaB_2O_4$, and is well suited for high-power UV generation. Unfortunately, $CsLiB_6O_{10}$ is an extremely hygroscopic material that is difficult to manufacture; as a result, it has achieved only limited commercial success.

Another borate crystal, $Sr_2Be_2(BO_3)_2O$ (Chuangtian et al. U.S. Pat. No. 5,523,026), has been promoted for generating short-wavelength light. To date, crystals of this material have not been grown with sufficient size and purity to demonstrate commercial viability.

Recently, $KBe_2BO_3F_2$ crystals have been used to generate wavelengths shorter than 200 nm [see Tagashi, et al. Optics Letters 2003, 28(4), 254-256]. However, $KBe_2BO_3F_2$ has not been grown to commercially acceptable sizes, and it is too soft to be reliably cut and polished.

Doped and undoped materials known prior to the present application having the general formula $(La,Ln)Sc_3(BO_3)_4$ (Ln=lanthanide) generally crystallize in the space groups Cc, C2/c, or C2. These latter groups commonly have been associated with the laser material $Nd:LaSc_3(BO_3)_4$. See, Li, Yunkui; Aka, G.; Kahn-Harari, A.; Vivien, D.; Phase Transition, Growth, and Optical Properties of $Nd_xLa_{1-x}Sc_3(BO_3)_4$ Crystals, J Mater. Res. 2001, 16, 38-44. Despite numerous studies reported in the technical and patent literature concerning $Nd:LaSc_3(BO_3)_4$, apparently no one previously considered using these materials for nonlinear optical applications involving the production of UV and VUV light. The literature primarily addresses using $Nd:LaSc_3(BO_3)_4$ as a laser material. Certain compounds belonging to the same series of materials also have appeared in the Russian-language literature. See, Kuz'micheva, G. M.; Rybakov, V. B.; Novikov, S. G.; Ageev, A. Yu; Kutovoi, S. A.; Kuz'min, O. V.; Zhurnal Neorganicheskoi Khimii; Disordered Structures of Rare Earth Scandoborates of the Huntite Family, 1999, 44(3), 352-366, incorporated herein by reference.

Known NLO compounds are limited in their application to generation of UV and VUV light, are damaged by exposure to high-power lasers, exhibit excessive absorption and light scattering of incident or absorbed light, and/or are too costly and time consuming for commercial production. As a result, there is a continuing need for new NLO compounds, methods for their manufacture, crystallization, and use.

SUMMARY

The present disclosure concerns a material, particularly a nonlinear optical material, according to Formula 1.

$$M_xM'_ySc_z(BO_3)_4 \qquad \text{Formula 1}$$

With reference to Formula 1, the sum of x, y, and z is about four, and M and M' preferably are selected from the group consisting of La, Pr, Sm, Eu, Gd, Tb, Dy, Ho, Er, Tm, Yb, Lu, Sc and Y. Particularly useful metals are independently selected from the group consisting of Y, Pr, Gd, Yb and Lu.

A second embodiment of the present disclosure is more particularly directed to a nonlinear optical material according to Formula 2.

$$La_xM_ySc_z(BO_3)_4 \qquad \text{Formula 2}$$

With reference to Formula 2, each of x, y, and z is greater than zero, and the sum of x, y and z is about four. M is selected from the group consisting of rare earth metals if y is greater than 0.3, or is selected from the group of rare earth metals other than Nd, including La, Pr, Sm, Eu, Gd, Tb, Dy, Ho, Er, Tm, Yb, Lu, Sc and Y.

A third embodiment of the present disclosure concerns a nonlinear optical material where metal M of Formula 2 is a mixture of rare earth metals, i.e., such compounds have mixed stochiometries (Ln and Ln') indicated by Formula 3.

$$La_{1-x}(Ln,Ln')_xSc_3(BO_3)_4 \qquad \text{Formula 3}$$

With reference to Formula 3, x is greater than zero and less than one. Ln and Ln' are independently selected from the group of rare earth metals, such as La, Pr, Sm, Eu, Gd, Tb, Dy, Ho, Er, Tm, Yb, Lu, Sc and Y, with particularly useful metals for Ln and Ln' being independently selected from the group consisting of Y, Pr, Gd, Yb and Lu.

A fourth embodiment of the present disclosure concerns a nonlinear optical material according to Formula 4.

$$La_{1-x}Y_xSc_3(BO_3)_4 \qquad \text{Formula 4}$$

With respect to Formula 4, x is greater than zero and less than one. Typically, x varies from about 0.2 to about 0.4, and currently preferred compounds have x vary from about 0.25 to about 0.35. One example, without limitation, of a compound satisfying Formula 4 is $La_{0.7}Y_{0.3}Sc_3(BO_3)_4$.

The present disclosure also is directed to compositions comprising a material or materials according to Formulas 1-4. Such compositions can include, for example, and without limitation: combinations of materials satisfying Formulas 1-4; a first nonlinear optical material according to any of Formulas 1-4 in combination with another material or materials that facilitate optical applications, whether such material or materials are optical materials (e.g., laser or NLO materials) or not; and at least a first material satisfying Formulas 1-4, and at least a second nonlinear optical material known prior or subsequent to the present disclosure, with or without a laser material.

A method for crystallizing NLO materials disclosed herein also is described. The method generally comprises forming a trigonal phase from a flux comprising lithium borate and yttrium oxide. In a working embodiment, the flux was formed using $Li_2CO_3$, $B_2O_3$ and $Y_2O_3$ in an approximate ratio of 16:11:1. A mixture is formed comprising the flux and a first compound for crystallization, such as a compound satisfying any of Formulas 1-4. Generally, the mixture is heated to a temperature sufficient for melting. Working embodiments typically have heated the mixture to a temperature of about 1,350 K. An oriented seed crystal is added to the melt, and the melt with seed crystal is then cooled at a cooling rate suitable to initiate crystal growth. Crystal growth is continued until a desired crystal size is obtained.

Further embodiments of the disclosure concern devices that employ nonlinear optical materials. One such device is, without limitation, an optical parametric oscillator (OPO). An OPO uses NLO materials to produce widely tunable coherent light. Optical devices of the present invention comprise a light source, such as a laser, optically coupled to nonlinear optical materials described herein or combinations thereof. Such devices may be used to generate UV light, VUV light or both.

DETAILED DESCRIPTION

I. General Molecular Formulas

Figure 1:
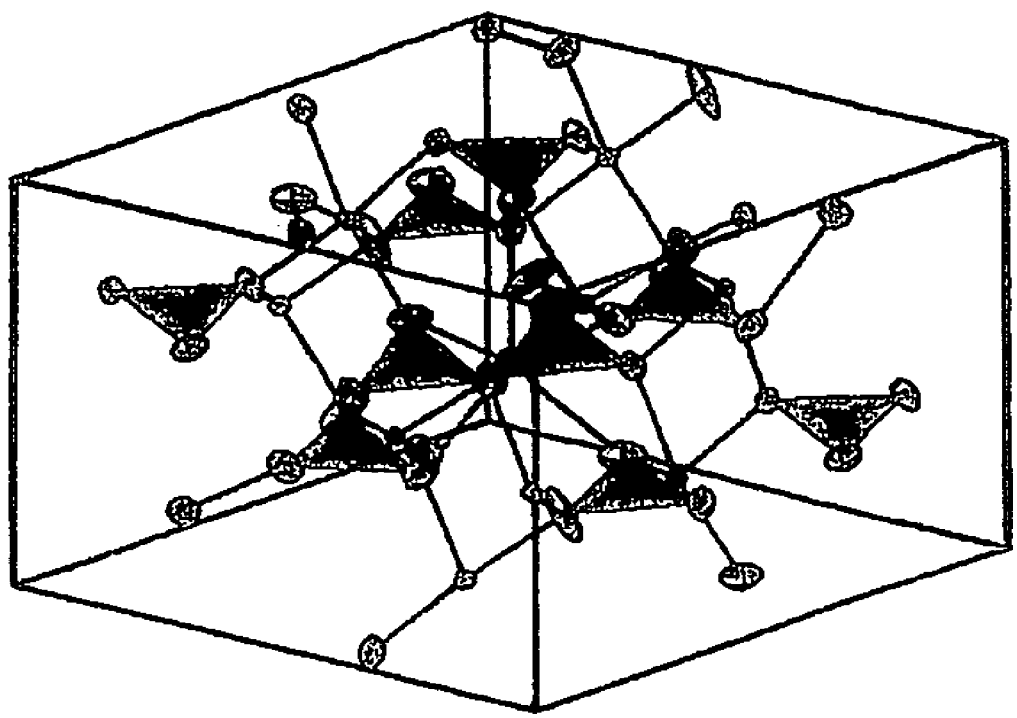
FIG. 1 is a structural drawing of a compound having the formula $M_xM'_ySc_z(BO_3)_4$.

Disclosed embodiments of the present class of compounds typically satisfy Formula 1

$$M_xM'_ySc_z(BO_3)_4,\qquad\text{Formula 1}$$

where M and M' are metals and the sum of x, y, and z is about four. M and M' typically are rare earth metals and combinations of rare earth metals. The rare earth metals are defined herein to include the lanthanides (elements 57-71), scandium and yttrium. M and M' preferably are independently selected from the group consisting of La, Pr, Sm, Eu, Gd, Th, Dy, Ho, Er, Tm, Yb, Lu, Sc and Y, and are more typically independently selected from the group consisting of La, Pr, Dy, Ho, Er, Yb, Lu, Sc and Y. Particularly useful metals are independently selected from the group consisting of Y, Pr, Gd, Yb and Lu. However, with reference to Formula 1, where one of M or M' is Ce, then the remaining metal is other than Gd or Nd. And if one of M or M' is La, then the remaining metal is other than Nd, or x is greater than 0.3. Structural variations are observed for this family, depending on the identity of the rare earth metals selected.

A second embodiment of the present disclosure is directed more particularly to a nonlinear optical material according to Formula 2.

$$La_xM_ySc_z(BO_3)_4\qquad\text{Formula 2}$$

With reference to Formula 2, each of x, y, and z is greater than zero, and the sum of x, y and z is about four. M is selected from the group consisting of rare earth metals if y is greater than 0.3, or is selected from the group of rare earth metals other than Nd, including La, Pr, Sm, Eu, Th, Dy, Ho, Er, Tm, Yb, Lu, Sc and Y. Particular embodiments of M are selected from the group consisting of Y, Pr, Gd, Yb and Lu, and combinations thereof.

A third embodiment of the present disclosure concerns a nonlinear optical material where metal M of Formula 2 is a mixture of rare earth metals, i.e., such compounds have mixed stochiometries (Ln,Ln') indicated by Formula 3.

$$La_{1-x}(Ln,Ln')_xSc_3(BO_3)_4\qquad\text{Formula 3}$$

With reference to Formula 3, x is greater than zero and less than one, and more typically x varies from about 0.2 to about 0.4, with currently preferred compounds having x vary from about 0.25 to about 0.35. Ln and Ln' independently are selected from the group of rare earth metals, such as La, Pr, Sm, Eu, Gd, Th, Dy, Ho, Er, Tm, Yb, Lu, Sc and Y, and are more typically independently selected from the group consisting of La, Pr, Gd, Dy, Ho, Er, Yb, Lu, Sc and Y. Particularly useful metals for Ln and Ln' are independently selected from the group consisting of Y, Pr, Gd, Yb and Lu.

Using the general synthesis described herein, selected samples of the mixed stochiometries $La_{1-x}(Ln,Ln')_xSc_3(BO_3)_4$ satisfying Formula 3 have been prepared. For example, compounds where Ln=Y and Ln'=Dy, Ho, and Er have been made. X-ray powder diffraction measurements and second-harmonic tests establish that the samples crystallize in the R32 space group. Refined unit-cell parameters are provided below in Table 1.

TABLE 1

$La_{0.7}Y_{0.15}Ln_{0.15}Sc_3(BO_3)_4$

| | Cell Parameters for R32 Materials | |
|---|---|---|
| Ln | a | c |
| Dy | 9.77 | 8.00 |
| Ho | 9.77 | 8.00 |
| Er | 9.81 | 7.97 |

A fourth embodiment of the present disclosure concerns a nonlinear optical material according to Formula 4.

$$La_{1-x}Y_xSc_3(BO_3)_4\qquad\text{Formula 4}$$

With respect to Formula 4, x is greater than zero and less than one. Typically, x varies from about 0.2 to about 0.4, and currently preferred compounds have x varying from about 0.25 to about 0.35. One example, without limitation, of a compound satisfying Formula 4 is $La_{0.7}Y_{0.3}Sc_3(BO_3)_4$.

A. Space Group

Materials suitable for NLO applications often crystallize in a particular space group, such as the R32 space group. As a result, claimed compounds include, but are not limited to, those satisfying any of Formulas 1-4 crystallized in the R32 space group. A particular example of such a compound is $La_{0.7}Y_{0.3}Sc_3(BO_3)_4$ crystallized in the R32 space group.

Prior to the present disclosure, the stabilization and growth of a widely transparent R32 form of the general formula $M_xM'_ySc_z(BO_3)_4$ had not been demonstrated. $La_{0.7}Y_{0.3}Sc_3(BO_3)_4$ appears to be the first example of such a compound. It is unique among all of the $MSc_3(BO_3)_4$ compounds in that it forms as a mixture of two rare earth metal atoms, La and Y, within a narrow composition range. The results of an X-ray diffraction study of the material, which establishes the structure of the compound, are summarized in Tables 2 and 3 below.

TABLE 2

Crystallographic data for $La_{0.75}Y_{0.25}Sc_3(BO_3)_4$.

| Parameter | Value/Property |
|---|---|
| Formula Weight, amu | 496.51 |
| Crystal System | Rhombohedral |
| Space Group | R32(h) [155] |
| a, Å | 9.805(3) |
| c, Å | 7.980(2) |
| V, Å³ | 664.4(2) |
| Z | 3 |
| $D_{calc}$, g cm$^{-3}$ | 3.722 |
| F(000) | 695 |
| Diffractometer | Rigaku AFC6R |
| Radiation | Mo Kα (λ = 0.71069) graphite-monochromated |
| Data Collection | ±h, k, ±l |
| No. Observations (total, unique) | 2065, 380 |
| ($F_o^2 \geq 3\sigma(F_o^2)$) | 380 |
| R | 0.022 |
| $R_w$ | 0.031 |
| Maximum Shift in Final Cycle | 0.00 |
| GOF | 1.07 |

$R = \Sigma ||F_o| - |F_c||  \Sigma/\Sigma |F_o| = 0.022$
$R_w = [(\Sigma w (|F_o| - |F_c|)^2/\Sigma w F_o^2)]^{1/2} = 0.031$

TABLE 3

Positional and thermal parameters ($B_{eq}$) and occupancy for $La_{0.75}Y_{0.25}Sc_3(BO_3)_4$.

| Atom | Wy | x | y | z | $B_{eq}^a$ |
|---|---|---|---|---|---|
| La$^b$ | 3a | 0 | 0 | 0 | 0.79(1) |
| Sc | 9d | 0.4572 | 0 | 0 | 0.56(2) |
| B(1) | 3b | 0 | 0 | ½ | 0.67(8) |
| B(2) | 9e | 0.5507(5) | 0 | ½ | 0.72(6) |
| O(1) | 9e | 0.1405(4) | 0 | ½ | 0.80(4) |
| O(2) | 18f | 0.5449(4) | 0.8580(4) | 0.4853(4) | 1.16(4) |
| O(3) | 9e | 0.4081(5) | 0 | ½ | 1.53(7) |

$^aB_{eq} = (8\pi/3)^2\Sigma_i \Sigma_j U_{ij} a_i^* a_j^* a_i a_j$
$^b$occupancy = 0.154/0.1667, remainder of site is occupied by Y as demonstrated by electron microprobe analysis The nonlinear signal of $La_{0.7}Y_{0.3}Sc_3(BO_3)_4$ is approximately 0.67 times that of the NLO material $BaB_2O_4$. Furthermore, the high birefringence of the material provides a means for angular phase matching to produce UV and VUV wavelengths, in addition to broadly tunable radiation of both short and long wavelengths in OPO wavelengths. Thus, materials having the general formula $M_xM'_ySc_z(BO_3)_4$, particularly $La_{0.7}Y_{0.3}Sc_3(BO_3)_4$, exhibit all of the characteristics in terms of optical and physical properties, as well as stability and manufacturability, that are necessary for a commercially successful NLO material.

Additional useful NLO materials according to general Formula 1, i.e., $M_xM'_ySc_z(BO_3)_4$, can be selected from the group consisting of those having M and M' independently selected from the group consisting of La, Y, Lu, Yb, and Pr. Examples of such compounds include, without limitation, $Pr_{1-x}Y_xSc_3(BO_3)_4$, $Pr_{1-x}La_xSc_3(BO_3)_4$, and $La_{1-x}Lu_xSc_3(BO_3)_4$.

Representative compounds having Formulas 1, 2, 3 and/or 4 have been made according to the general synthetic methodology discussed herein, including without limitation those compounds indicated by Table 4 below. If a mixture of phases is obtained, a substantially pure sample of the desired NLO phase can be obtained using the crystallization procedure described herein.

TABLE 4

| Composition | | | |
|---|---|---|---|
| Y | La | Sc | Phases |
| 0.1 | 0.9 | 3 | LSB |
| 0.15 | 0.85 | 3 | YLSB + LSB |
| 0.2 | 0.8 | 3 | YLSB + LSB |
| 0.25 | 0.75 | 3 | YLSB + LSB? |
| 0.25 | 0.75 | 3 | YLSB + LSB |
| 0.25 | 0.75 | 3 | YLSB + LSB |
| 0.3 | 0.7 | 3 | YLSB + LSB |
| 0.35 | 0.65 | 3 | YLSB + ScBO3 |
| 0.35 | 0.65 | 3 | YLSB |
| 0.35 | 0.65 | 3 | YLSB + ScBO3 |
| 0.37 | 0.63 | 3 | YLSB + ScBO3 |
| 0.39 | 0.61 | 3 | YLSB + ScBO3 |
| 0.4 | 0.6 | 3 | YLSB + ScBO3 |
| 0.41 | 0.59 | 3 | YLSB + ScBO3 |
| 0.45 | 0.55 | 3 | YLSB + ScBO3 |
| 0.5 | 0.5 | 3 | YLSB + ScBO3 + Sc2O3 |
| 0.65 | 0.35 | 3 | YLSB + ScBO3 + Sc2O3 |
| 0.7 | 0.3 | 3 | YLSB + ScBO3 |
| 0.8 | 0.2 | 3 | YLSB + ScBO3 + Sc2O3 |
| Dy.05 | 0.95 | 3 | LSB + DyLSB? |
| Dy.1 | 0.9 | 3 | LSB + DyLSB? |
| Dy.2 | 0.8 | 3 | LSB + DyLSB? |
| Dy.3 | 0.7 | 3 | DyLSB |
| Dy.4 | 0.6 | 3 | DyLSB + DyBO3 |
| Yb.25 | 0.75 | 3 | LSB + YbLSB |
| Yb.25 | 1 | 2.75 | LSB + Yb2O3? |

II. Compositions Comprising NLO Materials

The present disclosure also is directed to compositions comprising a material or materials according to Formulas 1-4. Such compositions can include combinations of materials satisfying Formulas 1-4. A first nonlinear optical material according to any of Formulas 1-4 also can be used in combination with another material or materials that facilitate optical applications, whether such materials are optical materials (e.g., laser or NLO materials) or not. For example, a first nonlinear optical material according to any of Formulas 1-4, or combinations of species satisfying Formulas 1-4, may be operatively associated with a second laser material. In another embodiment, a composition may include two or more materials, such as a first material according to Formulas 1-4, with a second material that does not operate as an optical material, but otherwise facilitates using compounds of the present disclosure. In yet another embodiment, the compositions may include at least a first material satisfying Formulas 1-4, and a second, known nonlinear optical material, with or without a laser material.

The compositions can be formed by methods currently known or hereafter developed. For example, physical mixtures of compounds may be formed by physically combining desired quantities of two or more materials. Alternatively, compositions may be formed by operatively coupling materials one to another, such as by joining materials by a method such as diffusion bonding (see the discussion of diffusion bonding in, for example, Meissner's U.S. Pat. No. 5,441,803, which is incorporated herein by reference) or other suitable method.

III. General Method for Making NLO Materials

A number of techniques, currently known or hereinafter developed, can be used to synthesize compounds that satisfy Formulas 1-4. In general, and without limitation, compounds satisfying the general formulas have been synthesized by heating appropriate molar amounts of starting materials to a temperature sufficient to form the nonlinear optical materials.

More particularly and with reference to working embodiments, appropriate starting materials and amounts thereof were selected and ground to a powder in a mortar and pestle. A mixture was then formed by combining the powdered starting materials together in appropriate molar amounts. The mixture was then heated, such as in a crucible, to a temperature sufficient to form desired compounds, preferably as a single-phase. Working embodiments typically were heated to a temperature of about 1,000° C.

Crystals were then allowed to grow from a flux melt. Transparent crystals of nonlinear optical materials were obtained by this process. The method for growing crystals satisfying Formulas 1-4 involves forming a trigonal phase from a lithium-borate, yttrium-oxide flux. Working embodiments formed this flux using substantially pure $Li_2CO_3$, $B_2O_3$ and $Y_2O_3$ in an approximate weight ratio of 16.66:11.11:1. Material to be crystallized was mixed with the flux material, and then heated to a temperature sufficient to melt the desired compound. Working embodiments have heated the mixture comprising flux and desired NLO material to a temperature of about 1,350 K. The flux is held at this temperature, or at least a temperature above the melting temperature, for a period of time, referred to as a "soak time," that is sufficient to provide a uniform melt composition. Working embodiments have used soak times of about 48 hours. An oriented seed crystal is added to the mixture, and the mixture cooled at a suitable rate to initiate crystal growth, such as a cooling rate of about 2K/day. Crystal growth is continued until a desired crystal size is obtained, and then the flux material is removed. Flux material is initially removed first by physical methods. Residual flux material attached to the crystal is removed by dissolution in strong acid, particularly a strong mineral acid, such as nitric acid.

IV. Nonlinear Optical Material Applications

Devices using nonlinear optical materials are known. Such devices can be used, without limitation, for direct second-harmonic frequency conversion of laser light to visible, UV, and VUV wavelengths. Further uses of nonlinear optical materials in devices include frequency mixing, including sum and difference frequency mixing of laser light to yield light having a wavelength selected from the group consisting of infrared, visible, UV, and VUV wavelengths.

A further application of the current nonlinear optical materials uses the materials in a system, such as a monoblock laser system. Systems can be fabricated using a composite containing the current nonlinear optical materials. Such composites can contain a first material according to any of Formulas 1-4, and a second material. The first material and the second material can be diffusion bonded or joined by another suitable method. Where the second material is a laser material, the nonlinear optical material can be oriented for angular phase matching and generation of the second harmonic of the laser.

A second system that can exploit nonlinear optical materials can be fabricated using two nonlinear optical materials and a laser material. The nonlinear optical materials can be the same or different materials, and one or both can be selected from crystals having any of general Formulas 1-4. A first nonlinear optical material can be joined to a laser material by diffusion bonding, or other suitable method, and the nonlinear material can be oriented for angular phase matching of the second harmonic of the laser. A second nonlinear optical material can be joined to the first by a similar suitable method, such as diffusion bonding. The second nonlinear optical crystal can be oriented to yield, in conjunction with the first material, the fourth harmonic of the laser.

Further details concerning NLO materials, methods for their use, and devices utilizing such compounds, are described in Keszler's U.S. Pat. Nos. 5,684,813, 5,677,921, 6,417,954, 6,441,949, and 6,500,364, which are incorporated herein by reference.

V. WORKING EXAMPLES

The following examples describe particular embodiments concerning the presently disclosed technology. These examples should be interpreted as illustrative with respect to particularly described embodiments only, and such examples are not intended to limit the invention to the specific features detailed therein. Thus, it should be understood that additional embodiments not limited to these particular features described are consistent with the following examples.

Example 1

This example describes the synthesis of $La_{0.7}Y_{03}Sc_3(BO_3)_4$. Lanthanum oxide ($La_2O_3$, 23.08 wt %, dried overnight in a drying oven), scandium oxide ($Sc_2O_3$, 41.87 wt %), yttrium oxide ($Y_2O_3$, 6.86 wt %) and boron oxide ($B_2O_3$, 28.19 wt %) were ground in a mortar and pestle. $LiBO_2$ [0.05×weight $La_{0.7}Y_{0.3}Sc_3(BO_3)_4$, e.g., about 0.2 g] was added and the mixture ground for 5 minutes. The ground material was transferred to a platinum crucible, covered, and heated in a furnace at 1° C. per minute, to 1,050° C. The material was held at this temperature for 2 hours, and then allowed to cool at 0.1° C. per minute. The material was then removed from the furnace and allowed to cool to room temperature. Several plate-like crystals were fractured from the material for X-ray crystallographic analysis.

Example 2

This example describes how the nonlinear optical materials described above can be used to generate second harmonic light energy. A Nd:YAG laser is used as a light source to generate 1064-nm light. This light is filtered and passed through a sample of NLO material prepared according to Example 1 and mounted on a silica glass plate. Second harmonic light energy emerges from the NLO crystal and is directed onto a photomultiplier tube to a dichroic mirror. The light energy may be monitored by an oscilloscope.

Example 3

This example describes a method for growing crystals of materials described herein. This particular example is directed to growing crystals of $Y_xLa_{1-x}Sc_{3\,(BO3)}{}_4$, x=0.2-0.4 (YLSB).

YLSB crystals have been grown by a high-temperature, top-seeded solution method. Lithium borate, $xLi_2O \cdot yB_2O_3$, was used as the flux, and extra $Y_2O_3$ was added to obtain the desired trigonal phase. A typical mixture for crystal growth was 1 $Y_{0.3}La_{0.7}Sc_3(BO_3)_4$, 0.45 $Y_2O_3$ (Stanford Materials, 99.999%), 7.5 $Li_2CO_3$ (Cerac, 99.99%) and 5 $B_2O_3$ (Cerac, 99.9%). The mixture was heated in a platinum crucible to 1,350 K and soaked for two days. An oriented seed was used to initiate growth and to determine the initial growth temperature. Crystals have been grown by cooling at a rate of 2K/day; crystal growth was continued until the desire boule size was obtained—typically 30×30×10 mm. Colorless, transparent crystals with natural facets have been produced with this method. The crystals are stable to water and acid, and hence the flux attached to the crystal can be readily dissolved in nitric acid.

Example 4

Figure 2:
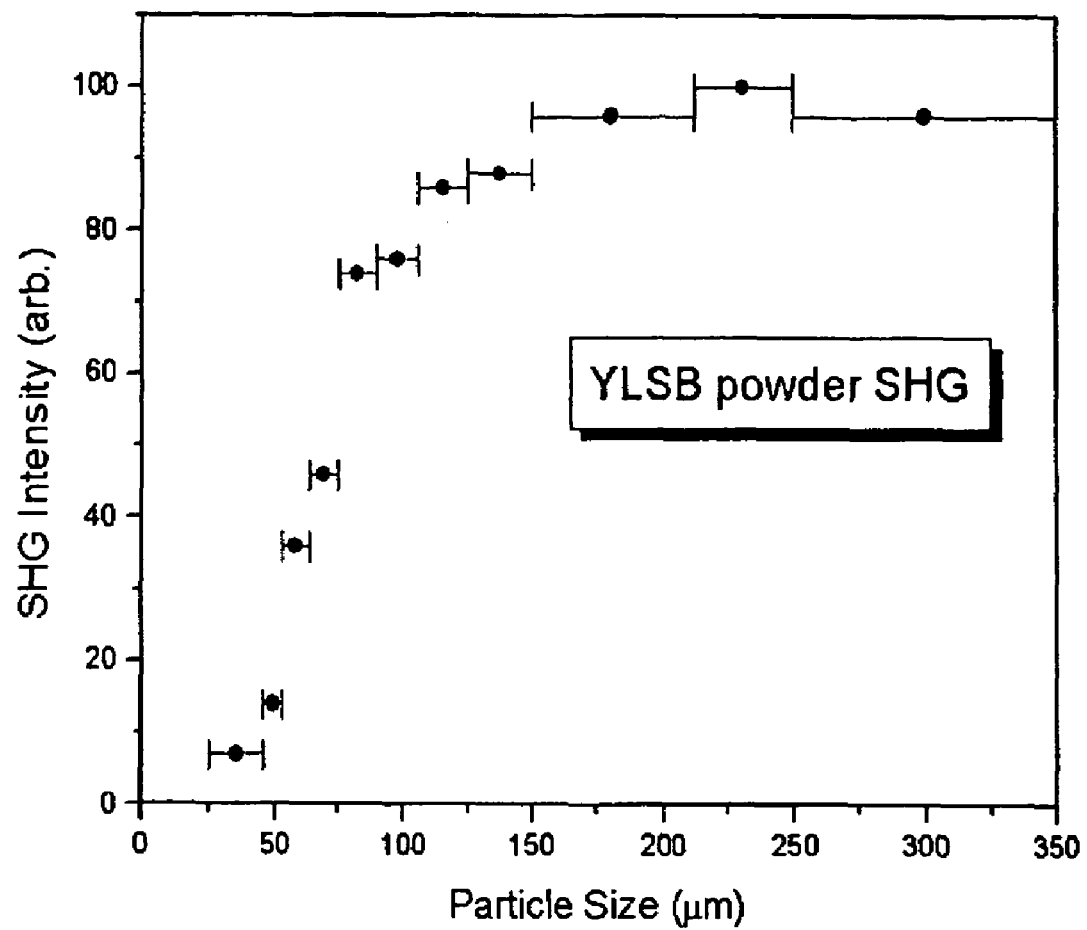
FIG. 2 is a phase matching curve of particle size (μm) versus intensity (second harmonic generation intensity) for crystals of materials described herein, with a fundamental wavelength of 1064 nm and a generated wavelength of 532 nm.
Figure 3:
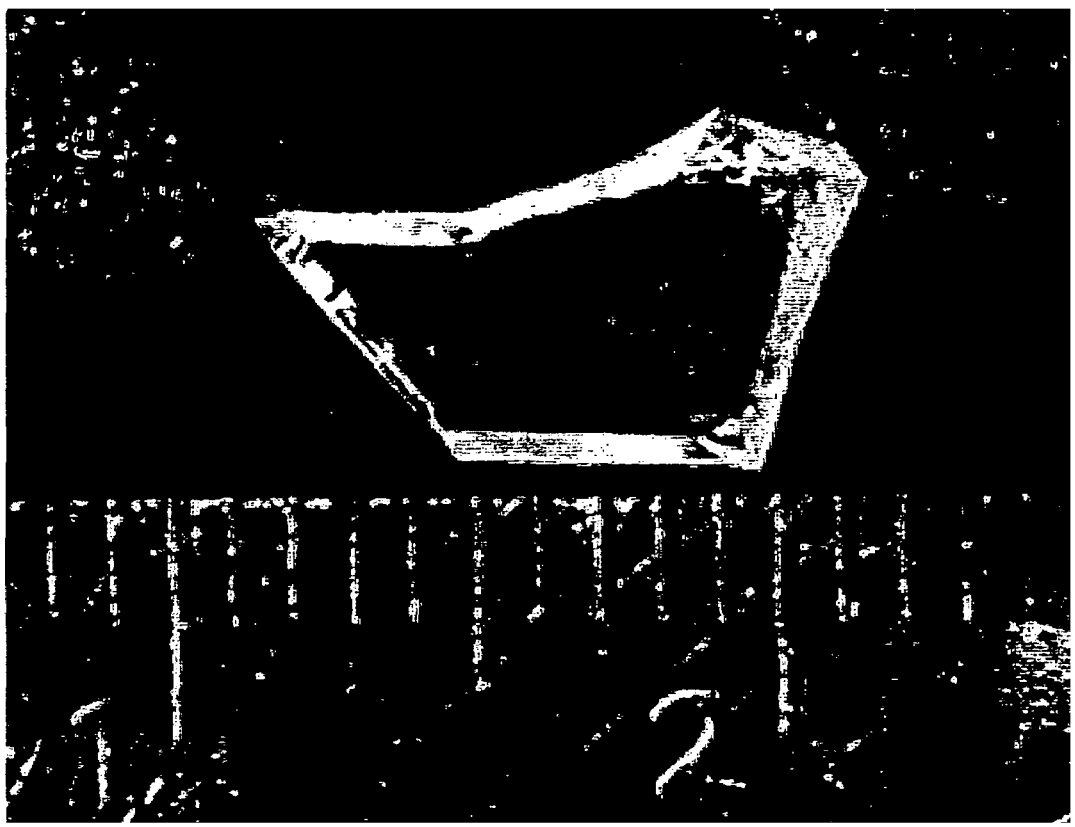
FIG. 3 is a cleaved portion of a yttrium-lanthanum, scandoborate (YLSB) boule.
Figure 4:
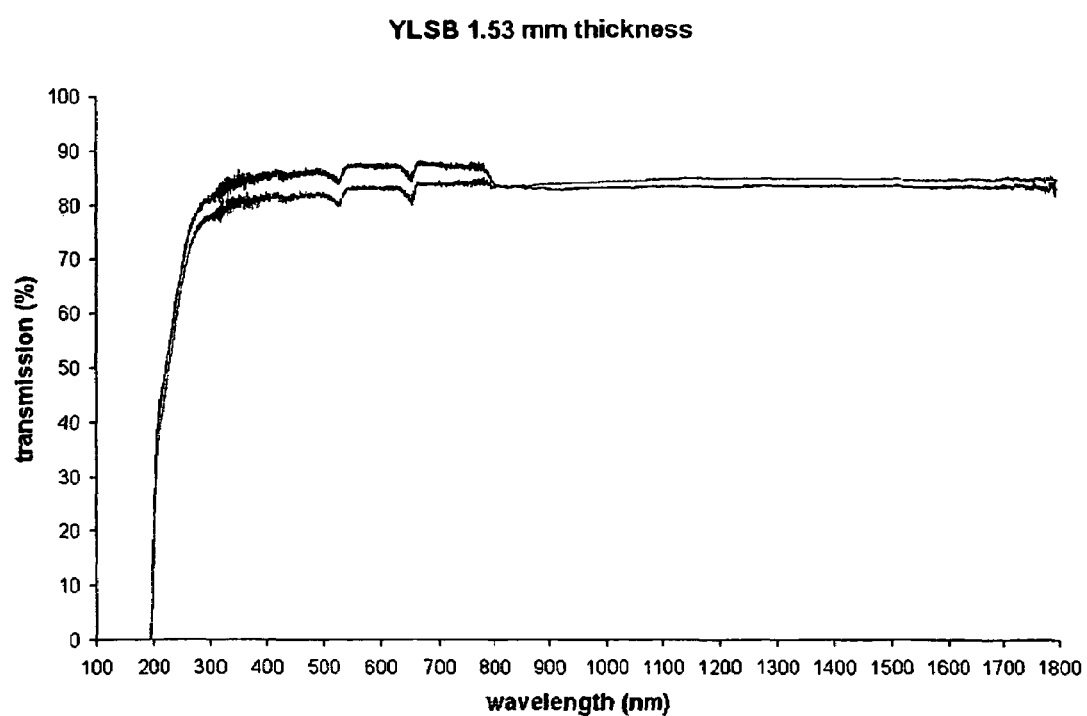
FIG. 4 is a transmission spectrum for YLSB crystals [wavelength (nm) versus transmission (%)].

This example concerns determining second-harmonic generation of light using crystals of materials described herein, such as the crystals described in Example 3. Phase-matched, second-harmonic generation of 532-nm light is observed by appropriately orienting the grown crystals in a 1064-nm laser beam. This phase-matched operation is also evident from measurements made on ground crystals, wherein the second-harmonic signal is monitored as a function of particle size. As shown in FIG. 2, the shape of the curve is consistent with phase-matched behavior Portions of the YLSB boules have been used (see FIG. 3) to determine transparency in the UV portion of the spectrum. The crystals exhibit preferred cleavage, and are mechanically robust and sufficiently hard to be readily polished. As shown in FIG. 4, the crystals exhibit high transparency in the UV portion of the spectrum. The high-energy, short-wavelength absorption cut-off has not been explicitly determined, since the loss of signal near 190 nm largely represents the wavelength limit of the spectrometer.

The present invention has been described with reference to preferred embodiments. Other embodiments of the invention will be apparent to those of ordinary skill in the art from a consideration of this specification, or practice of the invention disclosed herein. It is intended that the specification and examples be considered as exemplary only, with the true scope and spirit of the invention being indicated by the appended claims.

APPENDIX

The following references describe materials useful for optical applications, and applications of such materials. Each of the following documents is incorporated herein by reference:

1. Lin, ZhouBin; Hu, ZuShu; Han, XiuMei; Zhang, LiZhen; Wang, GuoFu. Spectral parameters of Nd3+ ion in λ-Nd3+: LaSc3(BO3)4 crystal. Physica Status Solidi B: Basic Research (2002), 231(2), 607-612.
2. Sardar, Dhiraj K.; French, Joe A.; Castano, Francisco; Sayka, Anthony; Salinas, Felipe S. Temperature effects on the 1.0 and 1.3 μm emission lines of Nd3+ in a LaSc3 (BO3)4 crystal host. Journal of Applied Physics (2002), 91(12), 9629-9634.
3. Danailov, M. B.; Demidovich, A. A.; Kuzmin, A. N.; Kuzmin, O. V.; Hait, V. L. On the performance of short pulse Nd3+:LSB microchip lasers. Applied Physics B: Lasers and Optics (2001), 73(7), 671-676.
4. Sardar, Dhiraj K.; Castano, Francisco; French, Joey A.; Gruber, John B.; Reynolds, Thomas A.; Alekel, Theodore; Keszler, Douglas A.; Clark, Benjamin L. Spectroscopic and laser properties of Nd3+ in LaSc3(BO3)4 host. Journal of Applied Physics (2001), 90(10), 4997-5001.
5. Lin, Zhou-Bin; Hu, Zu-Shu; Wang, Guo-Fu. Growth and characterization of γ-Nd3+:LaSc3(BO3)4 crystal. Jiegou Huaxue (2001), 20(4), 256-258.
6. Li, Yunkui; Aka, G.; Kahn-Harari, A.; Vivien, D. Phase transition, growth, and optical properties of NdxLa1-xSc3 (BO3)4 crystals. Journal of Materials Research (2001), 16(1), 38-44.
7. Kuz'micheva, G. M.; Rybakov, V. B.; Kutovoi, S. A.; Kuz'min, O. V.; Panyutin, V. L. Morphotropic series of LnSc3(BO3)4 compounds. Kristallografiya (2000), 45(6), 990-995.
8. Wang, Guofu; Chen, Wenzhi; Lin, Zhoubin; He, Meiyun; Hu, Zusbu. Neodymium-doped low-temperature phase lanthanum scandium borate self-frequency doubling laser crystal.
9. Faming Zhuanli Shenqing Gongkai Shuomingshu (2000) Demidovich, A. A.; Kuz'min, A. N.; Kuz'min, O. V.; Ryabtsev, G. I.; Strenk, W. Laser characteristics of Nd:LSB-KTP microchip under laser diode pumping.
10. Lietuvos Fizikos Zurnalas (1999), 39(4-5), 381-384. Lebedev, V. A.; Pisarenko, V. F.; Selina, N. V.; Perfilin, A. A.; Brik, M. G. Spectroscopic and luminescent properties of Yb,Er:LaSc3(BO3)4 crystals. Optical Materials (Amsterdam) (2000), 14(2), 121-126.
11. He, Meiyun; Wang, Guofu; Lin, Zhoubin; Chen, Wenzhi; Lu, Shaofang; Wu, Qiangjin. Structure of medium temperature phase β-LaSc3(BO3)4 crystal. Materials Research Innovations (1999), 2(6), 345-348.
12. Goryunov, A. V.; Kuz'micheva, G. M.; Mukhin, B. V.; Zharikov, E. V.; Ageev, A. Yu.; Kutovoi, S. A.; Kuz'min, O. V. X-ray diffraction study of the crystals LaSc3(BO3)4 activated with chromium and neodymium ions. Zhurnal Neorganicheskoi Khimii (1996), 41(10), 1605-1611.

We claim:

1. A compound according to the formula $La_{1-x}Y_xSc_3(BO_3)_4$ where x varies from about 0.2 to about 0.4.
2. The compound according to claim 1 where x varies from about 0.25 to about 0.35.
3. The compound according to claim 1 having a formula $La_{0.7}Y_{0.3}Sc_3(BO_3)_4$.
4. A composition, comprising:
   a first material of the formula $La_{1-x}Y_xSc_3(BO_3)_4$ where x varies from about 0.2 to about 0.4; and
   a second material.
5. The composition according to claim 4 where x varies from about 0.25 to about 0.35.
6. The composition according to claim 4 where the first material is crystallized in the R32 space group.
7. A device for generating high energy UV light, comprising:
   a laser; and
   a nonlinear optical material having the formula $La_{1-x}Y_xSc_3(BO_3)_4$ where x varies from about 0.2 to about 0.4.
8. The device according to claim 7, where x varies from about 0.25 to about 0.35.
9. The device according to claim 7 where the material is crystallized in the R32 space group.
10. The device according to claim 7 where the nonlinear optical material is $La_{0.7}Y_{0.3}Sc_3(BO_3)_4$.

* * * * *

UNITED STATES PATENT AND TRADEMARK OFFICE
CERTIFICATE OF CORRECTION

PATENT NO.         : 7,534,377 B2  
APPLICATION NO. : 10/520364  
DATED                   : May 19, 2009  
INVENTOR(S)         : Keszler et al.

It is certified that error appears in the above-identified patent and that said Letters Patent is hereby corrected as shown below:

In Column 1, line 3, immediately following the title, please add the following new heading and paragraph:

STATEMENT OF GOVERNMENT SUPPORT

This invention was made in part with United States Government support under Grant No. ECCS 0114017 awarded by the National Science Foundation. The United States Government has certain rights in the invention.

Signed and Sealed this

Fifteenth Day of September, 2009

David J. Kappos  
*Director of the United States Patent and Trademark Office*

UNITED STATES PATENT AND TRADEMARK OFFICE
CERTIFICATE OF CORRECTION

PATENT NO. : 7,534,377 B2
APPLICATION NO. : 10/520364
DATED : May 19, 2009
INVENTOR(S) : Keszler et al.

It is certified that error appears in the above-identified patent and that said Letters Patent is hereby corrected as shown below:

On the Title page:

Item (56) in the "Other Publications" section:

"Leonyuk N.I. and Leonyuk L.I., "Growth and Characterization ot ladVI3(IzIO3)4 Crystals," Prog. Crystal Growth and Charact., vol. 31, 1995-month unavailable, pp. 1 & 263-278.*" should read:

--"Leonyuk N.I. and Leonyuk L.I., "Growth and Characterization of $RM_3(BO_3)_4$ Crystal," *Prog. Crystal Growth and Charact.*, vol. 31, 1995-month unavailable, pp. 179-278."--

"Peterson et al., "Stoichiometric, trigonal hunite borate CeSc3*BO3)4, *International Journal of Inorganic Materials*, 2:1, p. 101-106 (February 1, 2000).*" should read:

--Peterson et al., "Stoichiometric, trigonal huntite borate $CeSc_3(BO_3)_4$, *International Journal of Inorganic Materials*, 2:1, p. 101-106 (February 1, 2000).--

"Durmanov S.T. *et al.* "Binary rare-earath scandium borate for diode-pumped lasers," *Optical Materials*, 18, pp. 234-384, (Nov. 2001)." should read:

--Durmanov S.T. *et al.* "Binary rare-earth scandium borate for diode-pumped lasers," *Optical Materials*, 18, pp. 234-284 (Nov. 2001).--

Signed and Sealed this
Twenty-fourth Day of December, 2013

Margaret A. Focarino
*Commissioner for Patents of the United States Patent and Trademark Office*

CERTIFICATE OF CORRECTION (continued)
U.S. Pat. No. 7,534,377 B2

In the specification:

Column 2, line 55, "stochiometries" should read --stoichiometries--.

Column 4, line 1, "Th" should read --Tb--;

Column 4, line 21, "Th" should read --Tb--;

Column 4, line 28, "stochiometries" should read --stoichiometries--;

Column 4, line 37, "Th" should read --Tb--; and

Column 4, line 42, "stochiometries" should read --stoichiometries--.

Column 8, line 35, "$La_{0.7}Y_{03}Sc_3$" should read --$La_{0.7}Y_{0.3}Sc_3$--; and Column 8, line 66, "$Y_xLa_{1-x}Sc_{3(BO3)4}$," should read --$Y_xLa_{1-x}Sc_3(BO_3)_4$,--.

Column 9, line 11, "desire" should read --desired--.